(12) United States Patent
Kuo et al.

(10) Patent No.: US 7,851,370 B2
(45) Date of Patent: Dec. 14, 2010

(54) PATTERNING METHOD

(75) Inventors: Lung-En Kuo, Chiayi County (TW); Jiunn-Hsiung Liao, Tainan County (TW); Min-Chieh Yang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 94 days.

(21) Appl. No.: 11/860,792

(22) Filed: Sep. 25, 2007

(65) Prior Publication Data

US 2009/0081817 A1    Mar. 26, 2009

(51) Int. Cl.
*H01L 21/302* (2006.01)
*H01L 21/461* (2006.01)

(52) U.S. Cl. .................. 438/734; 438/719; 438/749; 438/5

(58) Field of Classification Search .............. 438/5, 438/7–9, 719, 734, 749
See application file for complete search history.

(56) References Cited

U.S. PATENT DOCUMENTS

| 6,734,088 | B1 * | 5/2004 | Purdy et al. ................. 438/585 |
| 6,939,811 | B2 * | 9/2005 | Kamp et al. ................. 438/734 |
| 2004/0152331 | A1 * | 8/2004 | Xu et al. ..................... 438/719 |
| 2007/0020777 | A1 * | 1/2007 | Tso et al. ...................... 438/14 |
| 2008/0311687 | A1 * | 12/2008 | Yamashita et al. ............. 438/9 |

* cited by examiner

*Primary Examiner*—Charles D Garber
*Assistant Examiner*—Bryan R Junge
(74) *Attorney, Agent, or Firm*—J.C. Patents

(57) ABSTRACT

A patterning method is provided. In the patterning method, a film is formed on a substrate and a pre-layer information is measured. Next, an etching process is performed to etch the film. The etching process includes a main etching step, an etching endpoint detection step, an extension etching step and an over etching step. An extension etching time for performing the extension etching step is set within 10 seconds based on a predetermined correlation between an extension etching time and the pre-layer information, so as to achieve a required film profile.

20 Claims, 6 Drawing Sheets

PATTERNING METHOD

BACKGROUND OF THE INVENTION

1. Field of the Invention

The present invention relates to a method of manufacturing semiconductors, and more particularly, to a patterning method.

2. Description of Related Art

With development of semiconductor manufacturing technologies, critical dimensions (CDs) of features are minimized while integration of integrated circuits is continuously enhanced. In order to satisfy requirements for high density and great performance, it is necessary to precisely control the CDs of various features, profiles thereof, and uniformity thereof. In a complementary metal oxide semiconductor (CMOS) technology, a gate structure of a transistor is a key factor. Variations in the CDs and the profiles may give rise to speed differences, and reliability of devices is correspondingly affected. Accordingly, it is crucial to control a photolithography and etching process implemented for fabricating the gate structure.

In a typical manufacturing process of etching a polysilicon gate, different products may be produced in different recipes. That is to say, same types of products are fabricated in a certain recipe. The manufacturing process is usually carried out by performing a main etching step in a constant time, so as to etch a polysilicon layer to some degree. Thereafter, an etching endpoint detection step is implemented under different manufacturing conditions. Finally, an over etching step is performed under another manufacturing condition, so as to ensure that the polysilicon layer on a substrate is thoroughly etched. However, due to variations in manufacturing environment and in the manufacturing conditions, patterns formed by etching the polysilicon layer on within wafer or on without wafer are not completely the same and have undesired uniformity, which significantly reduces reliability of the devices.

U.S. patent publication No. 2007/0020777 discloses a method of controlling a formation of semiconductor devices. According to the disclosure of the '777 patent, a time required for performing an over etching step is determined and controlled based on both a correlation between a gate profile and a shallow trench isolation (STI) structure and a correlation between the gate profile and an over etching time, such that a gate formed through said method has a desired gate profile. However, referring to FIG. 1A, to achieve the desired gate profile, a longer time is usually required for performing the over etching step when a gate structure 102 formed by the method is etched. As such, a substrate 100 is severely damaged, resulting in the formation of a recess 104 in a great depth. What is more, production yield is significantly reduced due to an excessively low etching rate of the over etching step and a comparatively long period of time spent on the over etching step. On the other hand, referring to FIG. 1B, the recess may be formed in a relatively small depth when the time spent on the over etching step is reduced for minimizing the damages to the substrate 100. Nevertheless, a foot-shaped profile may be formed at a lower portion 106 of the gate structure 102, as indicated in FIG. 1B.

SUMMARY OF THE INVENTION

The present invention is directed to a patterning method capable of effectively controlling profiles of patterns to be formed without giving up production yield to a great extent.

The present invention provides a patterning method. In the patterning method, a film is formed on a substrate and a pre-layer information is measured. Next, an etching process is performed to etch the film. The etching process includes a main etching step, an etching endpoint detection step, an extension etching step and an over etching step. An extension etching time for performing the extension etching step is set within 10 seconds based on a predetermined correlation between an extension etching time and the pre-layer information, so as to achieve a required film profile.

According to an embodiment of the present invention, in the patterning method, the pre-layer information is measured through measuring a step height of an isolation structure formed in the substrate or measuring relevant information of the film before the etching process is performed thereon.

According to an embodiment of the present invention, in the patterning method, before the etching process is performed on the film, the relevant information of the film is measured through measuring a thickness of the film or measuring a thickness difference of the film at different locations.

According to an embodiment of the present invention, in the patterning method, the extension etching time is from 1 second to 5 seconds.

According to an embodiment of the present invention, in the patterning method, an etching rate of the extension etching step is between an etching rate of the main etching step and an etching rate of the over etching step.

According to an embodiment of the present invention, in the patterning method, the etching rate of the extension etching step is greater than the etching rate of the over etching step.

According to an embodiment of the present invention, in the patterning method, the etching rate of the extension etching step is less than the etching rate of the main etching step.

According to an embodiment of the present invention, in the patterning method, the etching rate of the extension etching step is substantially equal to an etching rate of the etching endpoint detection step.

According to an embodiment of the present invention, the patterning method further includes forming a bottom film between the film and the substrate. In the extension etching step, an etching selectivity of the film with respect to the bottom film is significantly different from the etching selectivity of the film with respect to the bottom film in the main etching step or in the over etching step, while said etching selectivity in the extension etching step is less different from or equal to the etching selectivity of the film with respect to the bottom film in the etching endpoint detection step.

According to an embodiment of the present invention, in the patterning method, the etching selectivity of the film with respect to the bottom film in the extension etching step is greater than the etching selectivity of the film with respect to the bottom film in the main etching step.

According to an embodiment of the present invention, in the patterning method, the etching selectivity of the film with respect to the bottom film in the extension etching step is less than the etching selectivity of the film with respect to the bottom film in the over etching step.

According to an embodiment of the present invention, in the patterning method, manufacturing parameters of the extension etching step are identical to those of the etching endpoint detection step, while a time parameter is excluded.

According to an embodiment of the present invention, in the patterning method, a plurality of manufacturing parameters of the extension etching step is identical to those of the etching endpoint detection step.

According to an embodiment of the present invention, in the patterning method, a reaction gas employed in the extension etching step and a gas flow thereof are identical to the reaction gas employed in the etching endpoint detection step and the gas flow thereof.

According to an embodiment of the present invention, in the patterning method, a reaction gas employed in the extension etching step and a gas flow thereof are different from the reaction gas employed in the main etching step or in the over etching step and the gas flow thereof.

According to an embodiment of the present invention, in the patterning method, the predetermined correlation between the extension etching time and the pre-layer information is established by at least the following. First, a first pre-layer information of a first substrate is measured, and the first pre-layer information includes a first step height of a first isolation structure in the first substrate or relevant information of a first film on the first substrate. Next, the first film on the first substrate is etched within a first extension etching time. Thereafter, a first film profile of the first film is measured. Afterwards, a second pre-layer information of a second substrate is measured, and the second pre-layer information includes a second step height of a second isolation structure in the second substrate or relevant information of a second film on the second substrate. After that, the second film is etched within a second extension etching time. A second film profile of the second film is then measured. Next, a correlation between the film profile and the pre-layer information is determined based on the first film profile, the second film profile, the first pre-layer information, and the second pre-layer information, whereas a correlation between the film profile and the extension etching time is determined based on the first film profile, the second film profile, the first extension etching time, and the second extension etching time.

According to an embodiment of the present invention, the patterning method further includes determining the predetermined correlation between the pre-layer information and the extension etching time based on a correlation between the film profile and the pre-layer information.

According to an embodiment of the present invention, the patterning method further includes measuring the film profile after the etching process is performed. Then, the predetermined correlation between the extension etching time and the pre-layer information is fed back and corrected based on the measured film profile.

According to an embodiment of the present invention, in the patterning method, a material of the film includes polysilicon.

According to an embodiment of the present invention, in the patterning method, the etching process is performed to etch the film, such that a gate structure is formed.

The patterning method disclosed by the embodiment of the present invention is capable of effectively controlling the profiles of the patterns to be formed through the implementation of the extension etching step, while production yield is not significantly reduced.

In order to the make the aforementioned and other objects, features and advantages of the present invention comprehensible, several embodiments accompanied with figures are described in detail below.

BRIEF DESCRIPTION OF THE DRAWINGS

FIG. 3 is a flowchart illustrating an etching process of a gate structure according to an embodiment of the present invention.

DESCRIPTION OF EMBODIMENTS

Figure 1A:
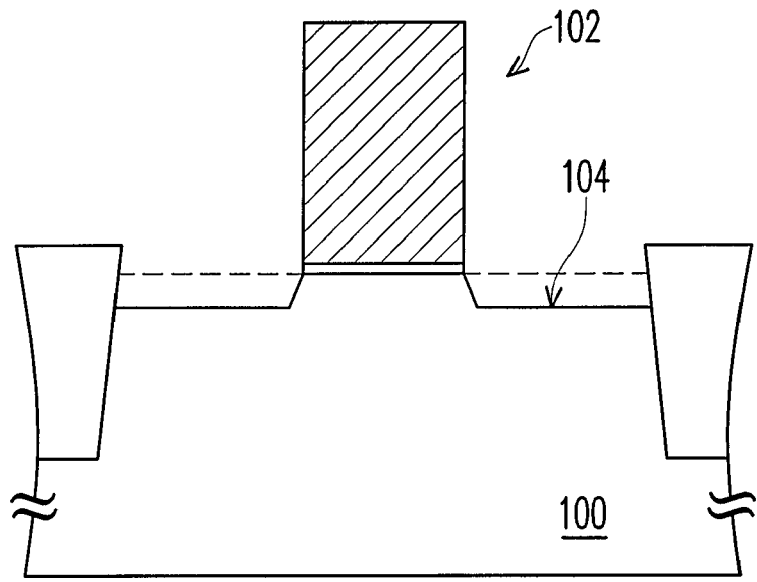
FIGS. 1A and 1B are schematic cross-sectional views illustrating a conventional gate structure having different profiles.
Figure 1B:
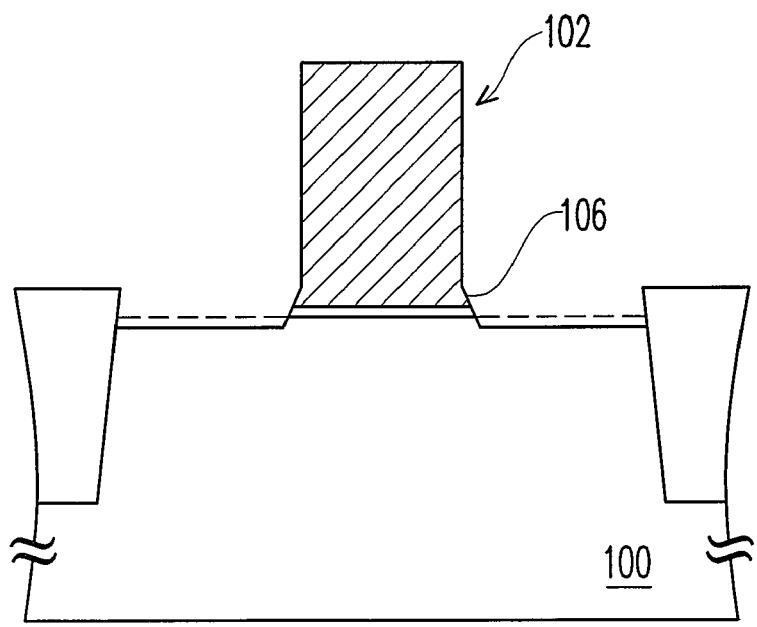
Figure 2A:
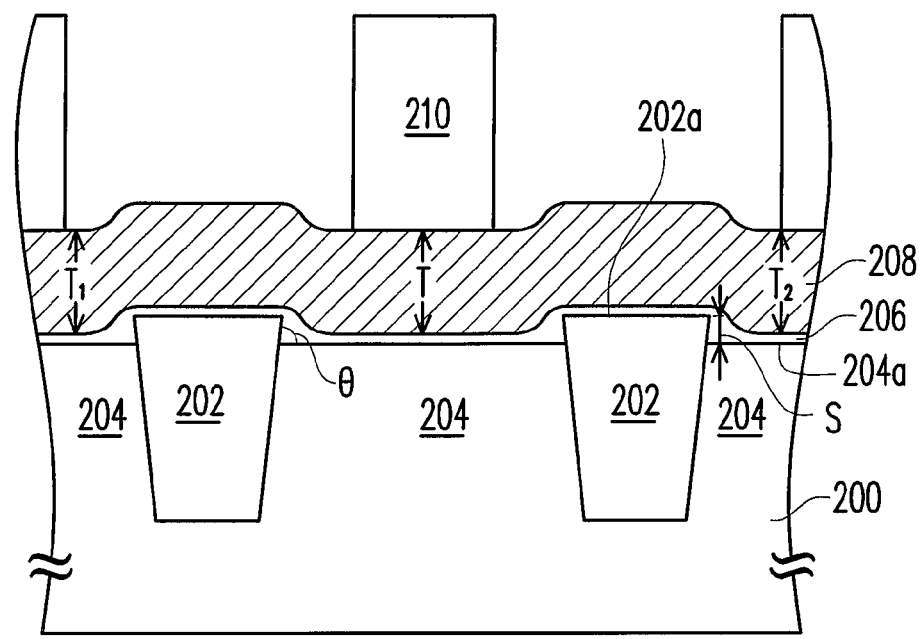
FIGS. 2A to 2B-3 are schematic cross-sectional flowcharts illustrating the steps of manufacturing a gate structure having different profiles according to an embodiment of the present invention.
Figures 1, 2B:
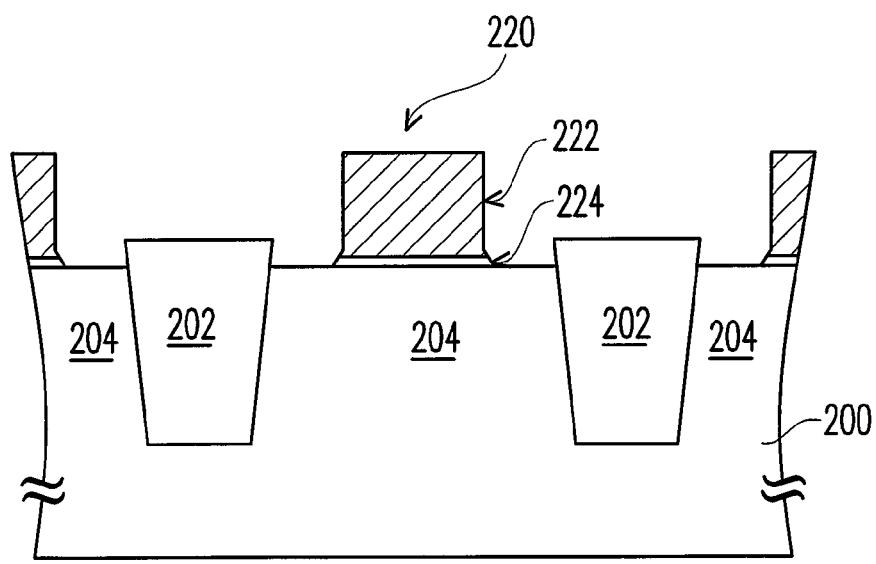

FIGS. 2A to 2B are schematic cross-sectional flowcharts illustrating the steps of manufacturing a gate structure according to an embodiment of the present invention.

Referring to FIG. 2A, isolation structures 202 are formed in a substrate 200 to define active regions 204. The isolation structures 202 are STI structures, for example. After the isolation structures 202 are formed, a step height S of an upper surface of one of the isolation structures 202 and an upper surface of the substrate 200 or a side wall angle θ of the isolation structures 202 may be measured first. Then, a gate dielectric layer 206 is formed on the substrate 200. A material of the gate dielectric layer 206 is, for example, silicon oxide, silicon nitride, SiON or any material with a high dielectric constant, and the gate dielectric layer 206 may be formed through thermal oxidation or chemical vapor deposition (CVD), for example. Next, a gate conductive layer 208 is formed on the gate dielectric layer 206. A material of the gate conductive layer 208 is, for example, polysilicon or any metal, and the gate conductive layer 208 may be formed through CVD, for example. Thereafter, relevant information of the gate conductive layer 208 is measured before an etching process is performed thereon. For example, the relevant information may include a thickness T of the gate conductive layer 208 or a thickness difference $\Delta T = T_1 - T_2$ of the gate conductive layer 208 disposed above different locations on the substrate 200. Here, the measured step height S of one of the isolation structures 202 and the relevant information of the gate conductive layer 208, i.e. the thickness T of the gate conductive layer 208 and the thickness difference $\Delta T$ of the gate conductive layer 208, are both referred to as a pre-layer information. After that, a patterned mask layer 210 is formed on the gate conductive layer 208. The patterned mask layer 210 is, for example, a patterned photoresist layer.

Figures 2, 2B:
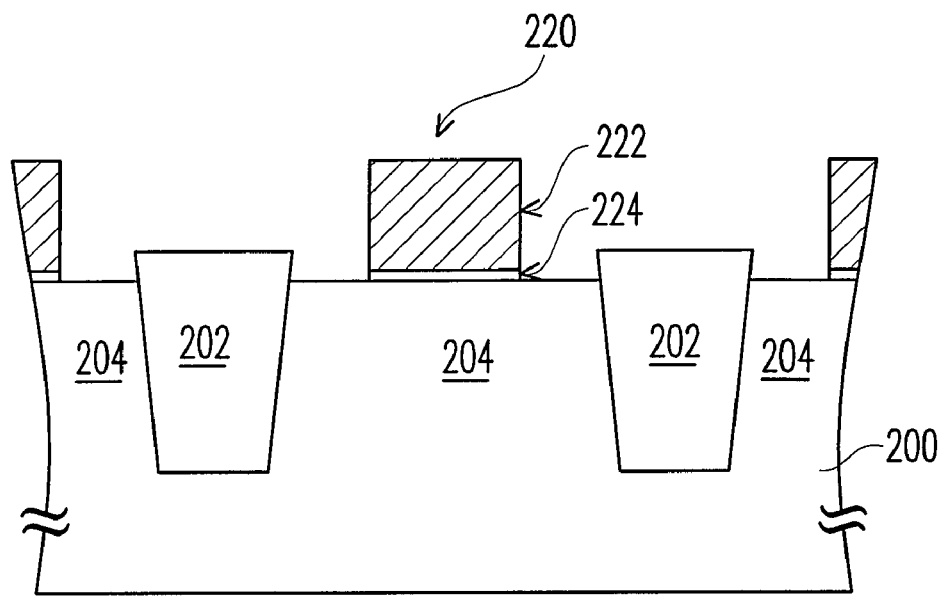
Figures 2, 2B, 3:
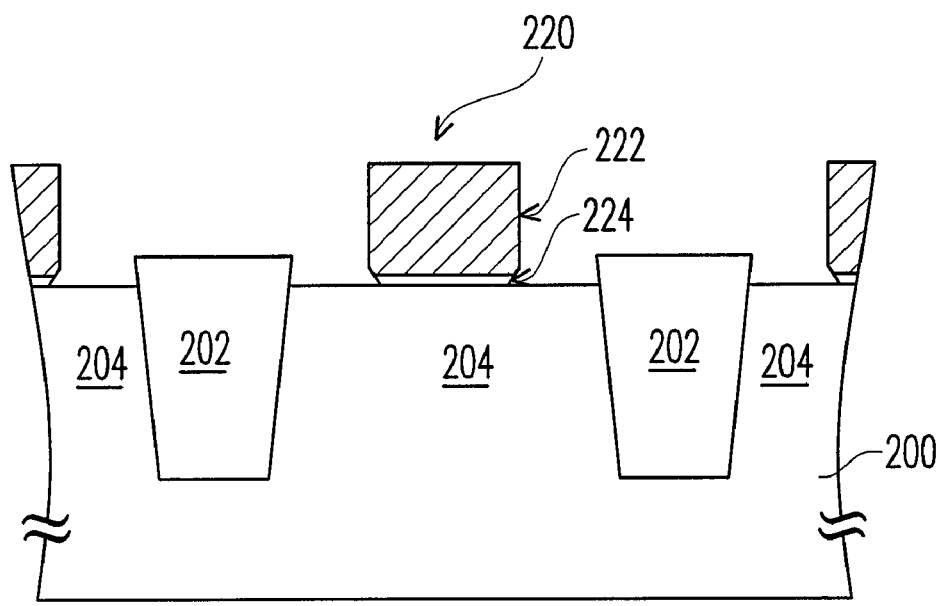
Figure 3:
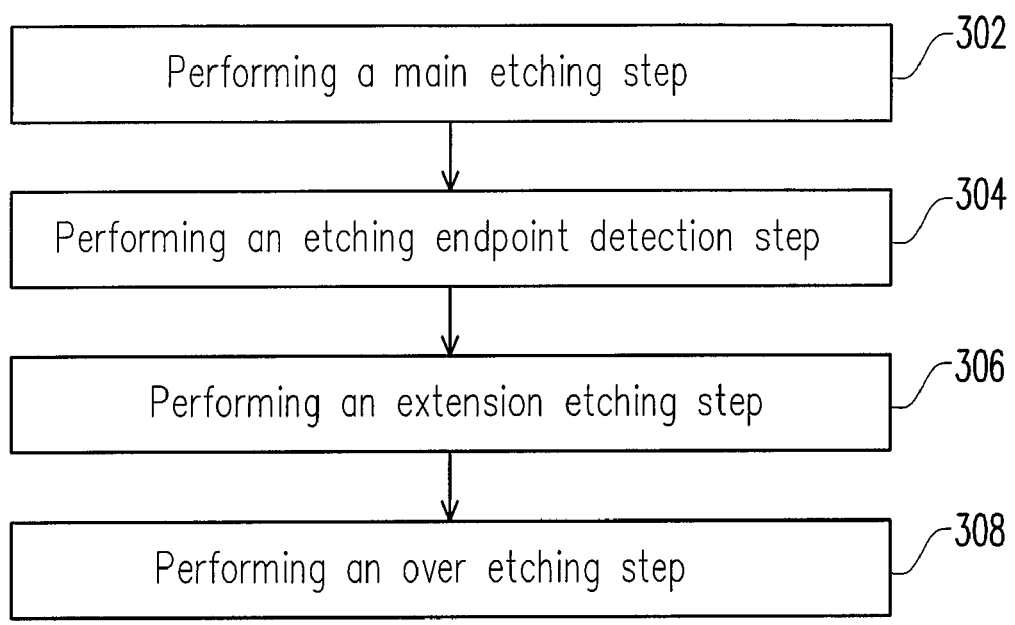

Afterwards, referring to FIG. 2B, the etching process is performed with use of the mask layer 210 as a mask. As such, the gate conductive layer 208 is etched, and a gate structure 220 having a required profile is then constructed. A typical etched gate structure 220 may have three possible types of the profiles, as respectively shown in FIGS. 2B-1, 2B-2, and 2B-3. The gate structure 220 may be divided into an upper portion 222 and a lower portion 224, and a main difference among the three types of the profiles lies in that the profiles of the lower portions 224 are distinctive. In FIG. 2B-1, the gate structure 220 has a foot-shaped lower portion 224. In FIG. 2B-2, the gate structure 220 has a normal lower portion 224. In FIG. 2B-3, the gate structure 220 has a notch-shaped lower portion 224.

Referring to FIGS. 2A and 3, the gate conductive layer 208 may be etched through performing a main etching step 302, an etching endpoint detection step 304, an extension etching step 306 and an over etching step 308 in sequence. During an implementation of the main etching step 302, manufacturing parameters adopted in the main etching step 302 allow the gate conductive layer 208 to be etched in a rapid pace. Thus, an etching rate of the main etching step 302 is the greatest among all of the etching steps, while an etching selectivity of the gate conductive layer 208 with respect to the gate dielectric layer 206 is rather small. The main etching step 302 may either be a single etching stage or include a plurality of the etching stages based on actual demands.

Further, the etching endpoint detection step 304 may be adopted to detect an endpoint of the etching process. In the etching endpoint detection step 304, a desired thickness of the gate conductive layer 208 is determined by detecting a change in a detected information. To prevent pitting of the substrate 200, the gate conductive layer 208 is not thoroughly etched. The extension etching step 306 is an additional step performed before the implementation of the over etching step 308. In the extension etching step 306, the etching selectivity of the gate conductive layer 208 with respect to the gate dielectric layer 206 is significantly different from the etching selectivity of the gate conductive layer 208 with respect to the gate dielectric layer 206 in the main etching step 302 or in the over etching step 308, while said etching selectivity in the extension etching step 306 is less different from or equal to the etching selectivity of the gate conductive layer 208 with respect to the gate dielectric layer 206 in the etching endpoint detection step 304. Etching rates of the etching endpoint detection step 304 and of the extension etching step 306 is between the etching rate of the main etching step 302 and the etching rate of the over etching step 308. Additionally, in the etching endpoint detection step 304 and the extension etching step 306, the etching selectivity of the gate conductive layer 208 with respect to the gate dielectric layer 206 is between the etching selectivity of the gate conductive layer 208 with respect to the gate dielectric layer 206 in the main etching step 302 and the etching selectivity in the over etching step 308. In detail, as the etching endpoint detection step 304 and the extension etching step 306 are performed, the etching selectivity of the gate conductive layer 208 with respect to the gate dielectric layer 206 in the two etching steps is greater than that in the main etching step 302 but less than that in the over etching step 308. The manufacturing parameters of the extension etching step 306 may be extremely similar to or even identical to those of the etching endpoint detection step 304, while a time parameter is excluded. In an embodiment, a reaction gas employed in the extension etching step 306, a gas flow thereof, a gas pressure thereof, a transformer coupled plasma (TCP) power thereof, and a bias voltage thereof are identical to those of the etching endpoint detection step 304 but different from those of the main etching step 302 and the over etching step 308. In another embodiment, the reaction gas employed in the extension etching step 306, the gas flow thereof, the gas pressure thereof, and the TCP power thereof are identical to those of the etching endpoint detection step 304, while the bias voltage of the extension etching step 306 is slightly different from that of the etching endpoint detection step 304. Thereby, the profile of the gate conductive layer may be finely adjusted.

An extension etching time for performing the extension etching step 306 is decided based on a predetermined correlation between an extension etching time and the pre-layer information, so as to achieve a required film profile. In most cases, the extension etching time is set within 10 seconds. In an embodiment, the extension etching time ranges from 1 second to 5 seconds.

On the other hand, the over etching step 308 is carried out after the etching endpoint detection step 304 is performed, so as to ensure that the gate conductive layer 208 above the substrate 200 is thoroughly etched. An etching rate of the over etching step 304 is the lowest among all of the etching steps, while the etching selectivity of the gate conductive layer 208 with respect to the gate dielectric layer 206 is rather large, so as to prevent the substrate 200 from being excessively etched. Besides, the over etching step 308 may either be the single etching stage or include a plurality of the etching stages based on the actual demands.

In addition, according to an embodiment, the gate conductive layer 208 is made of polysilicon and has a thickness of 1000 angstroms. The main etching (ME) step 302 performed on the gate conductive layer 208 includes two etching stages, and so does the over etching (OE) step 308 performed thereon. The manufacturing conditions under which each etching step is carried out are indicated in Table 1. The extension etching (EXT) step 306 and the etching endpoint detection (EP) step 304 are performed in the same manner, and the extension etching time is defined as 3 seconds based on a predetermined correlation between the extension etching time and the thickness difference of the gate conductive layer disposed above different locations on the substrate.

TABLE 1

| Step | Pressure (mTorr) | TCP Power (watt) | Bias Voltage Power (volt) | Reaction Gas and Gas Flow (sccm) | Time (sec.) |
| --- | --- | --- | --- | --- | --- |
| ME1 | 35 | 500 | 300 | $10SF_6/50NF_3/350CHF_3/300He$ | 23 |
| ME2 | 8 | 600 | 35 | $30CF_4/25Cl_2/250HBr/16HeO_2$ | 19 |
| EP | 10 | 350 | 75 | $200HBr/9HeO_2/50He$ | |
| EXT | 10 | 350 | 75 | $200HBr/9HeO_2/50He$ | 3 |
| OE1 | 10 | 300 | 35 | $160HBr/9HeO_2$ | 2 |
| OE2 | 60 | 700 | 150 | $200HBr/10HeO_2/200He$ | 35 | according to another embodiment, the gate conductive layer 208 is made of polysilicon and has a thickness of 1000 angstroms. The main etching (ME) step 302 performed on the gate conductive layer 208 includes a single etching stage, and so does the over etching (OE) step 308 performed thereon. The manufacturing conditions under which each etching step is carried out are indicated in Table 2. The extension etching (EXT) step 306 and the etching endpoint detection (EP) step 304 are performed in the same manner, and the extension etching time is defined as 4 seconds based on a predetermined correlation between the extension etching time and the thickness difference of the gate conductive layer disposed above different locations on the substrate.

TABLE 2

| Step | Pressure (mTorr) | TCP Power (watt) | Bias Voltage Power (volt) | Reaction Gas and Gas Flow (sccm) | Time (sec.) |
|---|---|---|---|---|---|
| ME1 | 35 | 500 | 300 | $10SF_6/50NF_3/350CHF_3/300He$ | 23 |
| ME2 | 8 | 600 | 35 | $30CF_4/25Cl_2/250HBr/16HeO_2$ | 19 |
| EP | 10 | 350 | 75 | $200HBr/9HeO_2/50He$ | |
| EXT | 10 | 350 | 75 | $200HBr/9HeO_2/50He$ | 4 |
| OE | 60 | 700 | 150 | $200HBr/10HeO_2/200He$ | 35 |

Figure 4A:
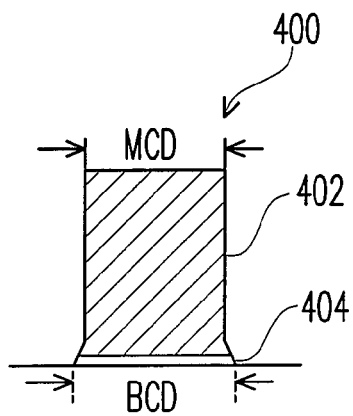
FIGS. 4A, 4B and 4C are schematic cross-sectional views illustrating three gate structures having different profiles.
Figure 4B:
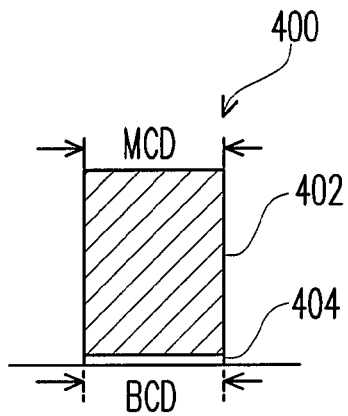
Figure 4C:
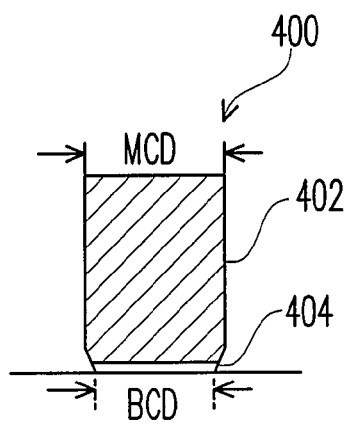

Contrarily, according to still another embodiment, the gate conductive layer 208 is made of polysilicon and has a thickness of 800 angstroms. The ME step 302 performed on the gate conductive layer 208 merely includes a single etching stage, and so does the OE step 308 performed thereon. The manufacturing conditions under which each etching step is carried out are indicated in Table 3. The EXT step 306 and the EP step 304 are performed in approximately the same manner, while the bias voltage of the EXT step 306 and that of the EP step 304 are slightly different. Besides, the extension etching time is defined as 6 seconds based on the predetermined correlation between the extension etching time and the thickness difference of the gate conductive layer disposed above different locations on the substrate.

lower portions 404 are distinctive. In FIG. 4A, the etched film 400 has the foot-shaped lower portion 404. In FIG. 4B, the lower portion 404 of the etched film 400 is normal. In FIG. 4C, the etched film 400 has the notch-shaped lower portion 404. The film profiles of the etched films 400 may be represented by a difference DCD (DCD=1/2(BCD−MCD)) between bottom critical dimensions (BCDs) of the lower portions 404 and middle critical dimensions (MCDs) of the upper portions 402. As the DCD is positive, the film 400 then has the foot-shaped lower portion 404, whereas the film 400 has the notch-shaped lower portion 404 as the DCD is negative. As the DCD is zero, the lower portion 404 of the etched film 400 is normal.

After the etching process of the films is completed, a correlation between a film profile DCD and the extension etching time is obtained based on the film profile of each film and the extension etching time thereof. In addition, a correlation

TABLE 3

| Step | Pressure (mTorr) | TCP Power (watt) | TCCT* | Bias Voltage Power (volt) | Reaction Gas and Gas Flow (sccm) | Time (sec.) |
|---|---|---|---|---|---|---|
| ME | 2.5 | 500 | 0.5 | 80 | $7SF_6/10NF_3/60CF_4$ | 20 |
| EP | 3 | 450 | 0.6 | 60 | $200HBr/15HeO_2$ | |
| EXT | 3 | 450 | 0.6 | 30 | $200HBr/15HeO_2$ | 6 |
| OE | 60 | 450 | 1.0 | 175 | $180HBr/10HeO_2/180He$ | 40 |

*TCCT: transformer coupled capacitive tunable

Figure 5:
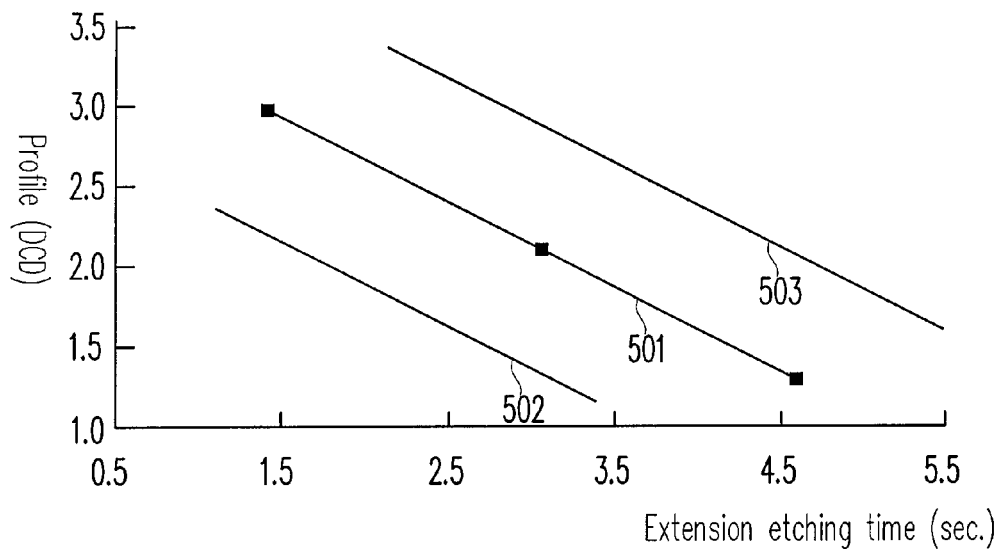
FIG. 5 is a diagram illustrating a correlation between a film profile DCD and an extension etching time according to an embodiment of the present invention.

The predetermined correlation between the extension etching time and the pre-layer information may be established by at least the following. First, a plurality of the isolation structures is formed on a plurality of the substrates, respectively, and a bottom film and a film are formed in sequence. The bottom film is, for example, a silicon oxide film, whereas the film is a polysilicon film, for example. Next, before the etching process is performed, the pre-layer information is measured. Here, the pre-layer information includes the step height of each of the isolation structures and the relevant information of each of the films before the etching process is performed thereon. The relevant information refers to the thickness of each of the films, the thickness differences among the films, and so on. Thereafter, the etching process is performed. The extension etching step in the entire etching process is implemented in various extension etching time. After that, the film profile of each of the etched films is measured. Due to the difference in the extension etching time, the film profile of each of the etched films is distinctive. A typical etched film may have three possible types of the profiles, as respectively shown in FIGS. 4A, 4B, and 4C. Each of the etched films 400 may be divided into an upper portion 402 and a lower portion 404, and the main difference among the three types of the profiles lies in that the profiles of the between the film profile DCD and the relevant information of the film before the etching process is performed thereon is obtained based on the film profile of each film and the pre-layer information. The two correlations are respectively illustrated in FIGS. 5 and 6. In FIG. 5, an Y axis represents the film profile DCD, while an X axis denotes the extension etching time (sec.). A line 501 is a correlation line representing the correlation between the film profile DCD and the extension etching time for samples having the same thickness difference $\Delta T_1$ of the film before the etching process is performed on the film. According to FIG. 5, the film profile DCD may vary upon the difference in the extension etching time. The shorter the extension etching time, the greater the film profile DCD, and the more likely to form the foot-shaped gate structure. Given that a plurality of the samples having various thickness differences $\Delta T$ is measured, more correlation lines may be acquired. As the thickness difference of the sample film is greater than $\Delta T_1$, a correlation line 503 above the correlation line 501 may be obtained. On the contrary, as the thickness difference of the sample film is less than $\Delta T_1$, a correlation line 502 below the correlation line 501 may be obtained.

Figure 6:
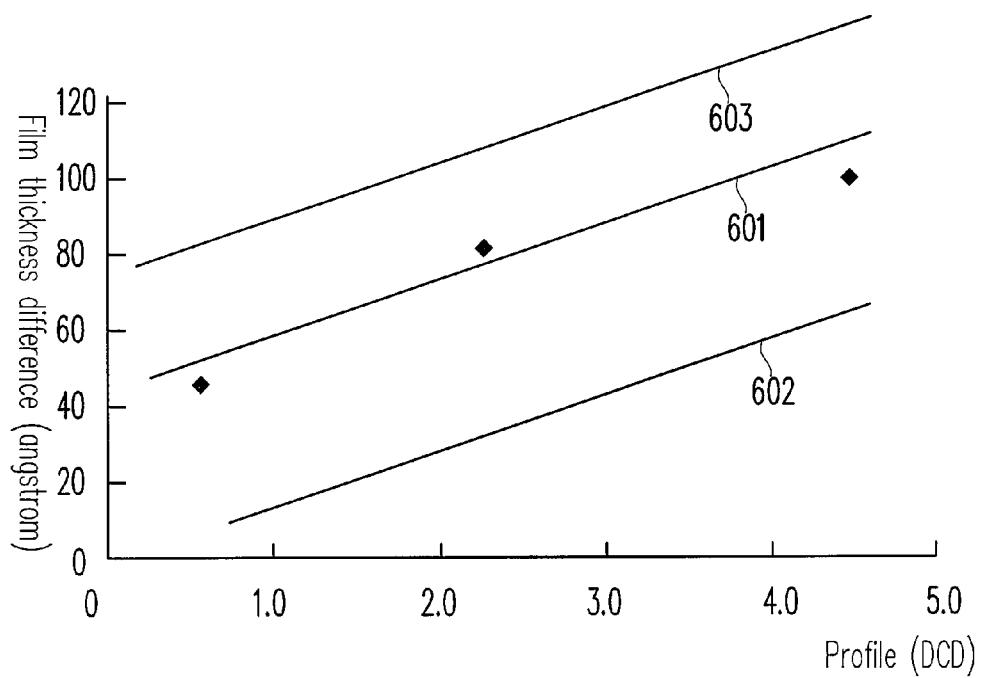
FIG. 6 is a diagram illustrating a correlation between the film profile DCD and a thickness difference of the film before the film is etched according to an embodiment of the present invention.

In FIG. 6, the Y axis represents the thickness difference $\Delta T = T_1 - T_2$ of the film above different locations on the substrate, while the X axis denotes the film profile DCD. A line 601 is the correlation line representing the correlation between the film profile DCD and the thickness difference ΔT before the film is etched for samples having the constant extension etching time $t_1$. According to FIG. 6, the film profile DCD may vary upon the thickness difference ΔT of the film before the etching process is performed thereon. The greater the thickness difference ΔT of the unetched film before the etching process is performed thereon, the more likely for the foot-shaped gate structure to be formed. Given that a plurality of the samples having various extension etching time T are measured, more correlation lines may be acquired. As the extension etching time of the sample is greater than $t_1$, a correlation line 603 above the correlation line 601 may be obtained. By contrast, as the extension etching time of the sample is less than $t_1$, a correlation line 602 below the correlation line 601 may be obtained.

Based on the above, the correlation between the extension etching time and the thickness difference ΔT of the film before the etching process is performed thereon may be observed with reference to FIGS. 5 and 6. During the implementation of the etching process, the extension etching time may be determined by referring to the correlation lines depicted in FIGS. 5 and 6 based on the required profile of the gate structure. The correlation between the film profile of each film and the extension etching time and the correlation between the film profile of each film and the pre-layer information may not only be illustrated by the drawings but also be presented in other forms, such as a lookup table or a formula.

After the gate conductive layer 208 is etched, an after-development-inspection (AEI) may be conducted to measure the profile of the constructed gate structure 220. Moreover, the measured results may be fed back to correct the predetermined correlation between the extension etching time and the pre-layer information. Thereby, the extension etching time of the to-be-etched gate conductive layer may be determined based on the predetermined corrected correlation between the extension etching time and the pre-layer information. As such, it is more likely for the gate structure to have the desired profile after the etching process is implemented.

According to the present invention, the extension etching step is additionally incorporated into the entire etching process of the gate. In the extension etching step, the extension etching time is decided based on the predetermined correlation between the extension etching time and the pre-layer information. Therefore, the gate profile can be effectively controlled, and etching uniformity may be improved. Moreover, the substrate can be prevented from being overly etched.

Furthermore, in the present invention, since the etching rate of the extension etching step additionally incorporated into the entire etching process performed on the gate exceeds the etching rate of the over etching step, only a short period of an additional time is required for effectively controlling the gate profile, and thus production yield is not reduced to a great extent.

Moreover, in the present invention, the variation of the etching process resulting from different products, patterns or etching apparatus can be adjusted to finely control the etched gate structure.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A patterning method, comprising:
   forming a film on a substrate;
   measuring a pre-layer information; and
   performing an etching process to etch the film, the etching process comprising a main etching step, an etching endpoint detection step, an extension etching step, and an over etching step, wherein the extension etching step is performed after the etching endpoint detection step is conducted, the etching rate of the extension etching step is substantially equal to an etching rate of the etching endpoint detection step, and an extension etching time for performing the extension etching step is set within 10 seconds based on a predetermined correlation between an extension etching time and the pre-layer information, so as to achieve a required film profile, wherein the pre-layer information comprises thickness difference of the film.

2. The patterning method of claim 1, wherein the pre-layer information is measured before the etching process is performed.

3. The patterning method of claim 2, wherein the relevant information of the film is thickness difference of the film at different locations.

4. The patterning method of claim 1, wherein the extension etching time is from 1 second to 5 seconds.

5. The patterning method of claim 1, wherein an etching rate of the extension etching step is between an etching rate of the main etching step and an etching rate of the over etching step.

6. The patterning method of claim 5, wherein the etching rate of the extension etching step is greater than the etching rate of the over etching step.

7. The patterning method of claim 5, wherein the etching rate of the extension etching step is less than the etching rate of the main etching step.

8. The patterning method of claim 1, further comprising forming a bottom film between the film and the substrate, wherein an etching selectivity of the film with respect to the bottom film in the extension etching step is significantly different from the etching selectivity of the film with respect to the bottom film disposed below the film in the main etching step or in the over etching step, while said etching selectivity in the extension etching step is less different from or equal to the etching selectivity of the film with respect to the bottom film in the etching endpoint detection step.

9. The patterning method of claim 8, wherein the etching selectivity of the film with respect to the bottom film in the extension etching step is greater than the etching selectivity of the film with respect to the bottom film in the main etching step.

10. The patterning method of claim 8, wherein the etching selectivity of the film with respect to the bottom film in the extension etching step is less than the etching selectivity of the film with respect to the bottom film in the over etching step.

11. The patterning method of claim 8, wherein manufacturing parameters of the extension etching step are identical to those of the etching endpoint detection step, while a time parameter is excluded.

12. The patterning method of claim 8, wherein a plurality of manufacturing parameters of the extension etching step is identical to those of the etching endpoint detection step.

13. The patterning method of claim 8, wherein a reaction gas employed in the extension etching step and a gas flow thereof are identical to the reaction gas employed in the etching endpoint detection step and the gas flow thereof.

14. The patterning method of claim 8, wherein a reaction gas employed in the extension etching step and a gas flow thereof are different from the reaction gas employed in the main etching step or in the over etching step and the gas flow thereof.

15. The patterning method of claim 1, wherein the predetermined correlation between the extension etching time and the pre-layer information is established by at least the following:
   measuring a first pre-layer information of a first substrate, the first pre-layer information comprising a first step height of a first isolation structure in the first substrate or relevant information of a first film on the first substrate;
   etching the first film on the first substrate within a first extension etching time;
   measuring a first film profile of the first film;
   measuring a second pre-layer information of a second substrate, the second pre-layer information comprising a second step height of a second isolation structure in the second substrate or relevant information of a second film on the second substrate;
   etching the second film within a second extension etching time;
   measuring a second film profile of the second film;
   determining a correlation between the film profile and the pre-layer information based on the first film profile, the second film profile, the first pre-layer information, and the second pre-layer information; and
   determining a correlation between the film profile and the extension etching time based on the first film profile, the second film profile, the first extension etching time, and the second extension etching time.

16. The patterning method of claim 11, further comprising determining the predetermined correlation between the pre-layer information and the extension etching time based on a correlation between the film profile and the pre-layer information.

17. The patterning method of claim 1, further comprising:
   measuring the film profile after the etching process is performed; and
   feeding back and correcting the predetermined correlation between the extension etching time and the pre-layer information based on the measured film profile.

18. The patterning method of claim 1, wherein a material of the film comprises polysilicon.

19. The patterning method of claim 1, wherein the etching process is performed to etch the film, such that a gate structure is formed.

20. A patterning method, comprising:
   forming a bottom film on a substrate;
   forming a film on the bottom film;
   measuring a pre-layer information; and
   performing an etching process to etch the film, the etching process comprising a main etching step, an etching endpoint detection step, an extension etching step, and an over etching step, wherein an etching rate of the extension etching step is greater than etching rate of the over etching step and is substantially equal to an etching rate of the etching endpoint detection step; an etching selectivity of the film with respect to the bottom film in the extension etching step is significantly different from the etching selectivity of the film with respect to the bottom film disposed below the film in the main etching step or in the over etching step, while the etching selectivity in the extension etching step is less different from or equal to the etching selectivity of the film with respect to the bottom film in the etching endpoint detection step; and a reaction gas employed in the extension etching step and a gas flow thereof are identical to the reaction gas employed in the etching endpoint detection step and the gas flow thereof, and the reaction gas employed in the extension etching step and the gas flow thereof are different from the reaction gas employed in the main etching step or in the over etching step and the gas flow thereof.

* * * * *